(12) United States Patent
Nagakura et al.

(10) Patent No.: US 12,501,653 B2
(45) Date of Patent: Dec. 16, 2025

(54) SEMICONDUCTOR DEVICE WITH CONTACT PLUGS

(71) Applicant: ROHM CO., LTD., Kyoto (JP)

(72) Inventors: So Nagakura, Kyoto (JP); Satoshi Iwahashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/624,167

(22) Filed: Apr. 2, 2024

(65) Prior Publication Data

US 2024/0243200 A1  Jul. 18, 2024

Related U.S. Application Data

(63) Continuation of application No. 18/191,538, filed on Mar. 28, 2023, now Pat. No. 11,984,501, which is a
(Continued)

(30) Foreign Application Priority Data

May 30, 2019  (JP) ................................. 2019-101621
Apr. 14, 2020  (JP) ................................. 2020-072389

(51) Int. Cl.
*H10D 30/66* (2025.01)
*H10D 30/60* (2025.01)
*H10D 64/23* (2025.01)

(52) U.S. Cl.
CPC ......... *H10D 30/668* (2025.01); *H10D 30/605* (2025.01); *H10D 30/663* (2025.01); *H10D 64/256* (2025.01)

(58) Field of Classification Search
CPC ........... H01L 29/1608; H01L 29/41766; H01L 29/66053–66068; H01L 29/045;
(Continued)

(56) References Cited

U.S. PATENT DOCUMENTS 11,205,720 B2 * 12/2021 Nagakura ........... H01L 29/0696
11,646,370 B2 *  5/2023 Nagakura ........... H01L 29/7809
257/341
(Continued)

FOREIGN PATENT DOCUMENTS

JP  2007-053226 A  3/2007
JP  2008098593 A  4/2008
(Continued)

OTHER PUBLICATIONS

Japanese Office Action issued Jan. 25, 2024 in corresponding Japanese Patent Application No. 2020-072389, 9 pages.
(Continued)

*Primary Examiner* — Eric A. Ward
(74) *Attorney, Agent, or Firm* — XSENSUS LLP

(57) ABSTRACT

A semiconductor device includes a semiconductor layer that has a first main surface at one side and a second main surface at another side, a plurality of gate electrodes that are arranged at intervals on the first main surface of the semiconductor layer, an interlayer insulating film that is formed on the first main surface of the semiconductor layer such as to cover the gate electrodes, an electrode film that is formed on the interlayer insulating film, and a plurality of tungsten plugs that, between a pair of the gate electrodes that are mutually adjacent, are respectively embedded in a plurality of contact openings formed in the interlayer insulating film at intervals in a direction in which the pair of mutually adjacent gate electrodes face each other and each have a bottom portion contacting the semiconductor layer and a top portion contacting the electrode film.

20 Claims, 8 Drawing Sheets

Related U.S. Application Data continuation of application No. 17/454,739, filed on Nov. 12, 2021, now Pat. No. 11,646,370, which is a continuation of application No. 16/886,198, filed on May 28, 2020, now Pat. No. 11,205,720.

(58) Field of Classification Search
CPC . H01L 29/0696; H01L 29/1095; H01L 29/45; H01L 29/456; H01L 29/66727; H01L 29/7802; H01L 29/7813; H01L 29/7836
See application file for complete search history.

(56) References Cited

U.S. PATENT DOCUMENTS

| | | | |
|---|---|---|---|
| 11,984,501 B2* | 5/2024 | Nagakura | H01L 29/7809 |
| 2006/0226475 A1* | 10/2006 | Yamamoto | H01L 29/66727 |
| | | | 257/E29.136 |
| 2008/0150018 A1* | 6/2008 | Tanabe | H10D 30/0297 |
| | | | 257/330 |
| 2009/0114982 A1 | 5/2009 | Saka et al. | |
| 2009/0166731 A1* | 7/2009 | Maruoka | H01L 29/7813 |
| | | | 438/270 |
| 2009/0242967 A1* | 10/2009 | Katsumata | H10B 43/50 |
| | | | 257/E21.409 |
| 2010/0117142 A1* | 5/2010 | Lin | H01L 29/7813 |
| | | | 257/327 |
| 2011/0017998 A1* | 1/2011 | Nakano | H01L 21/049 |
| | | | 257/77 |
| 2013/0240981 A1 | 9/2013 | Hutzler et al. | |
| 2014/0084359 A1* | 3/2014 | Tsuchiya | H10D 62/393 |
| | | | 438/285 |
| 2014/0103426 A1 | 4/2014 | Hsieh | |
| 2015/0076594 A1* | 3/2015 | Hsieh | H01L 29/7811 |
| | | | 257/334 |
| 2015/0137223 A1 | 5/2015 | Siemieniec et al. | |
| 2015/0372094 A1* | 12/2015 | Horii | H01L 23/5329 |
| | | | 257/77 |
| 2018/0114857 A1* | 4/2018 | Okada | H10D 89/611 |
| 2018/0182629 A1* | 6/2018 | Jantscher | H01L 21/76847 |
| 2019/0189509 A1* | 6/2019 | Bertrams | H01L 21/28556 |
| 2020/0295174 A1* | 9/2020 | Sabri | H10D 64/512 |

FOREIGN PATENT DOCUMENTS

| | | |
|---|---|---|
| JP | 2017-054928 A | 3/2017 |
| WO | 2012176503 A1 | 12/2012 |
| WO | 2016159385 A1 | 10/2016 |
| WO | 2016175152 A1 | 11/2016 |
| WO | 2018/220879 A1 | 12/2018 |
| WO | 2019/093015 A1 | 5/2019 |

OTHER PUBLICATIONS

Notice of Reasons for Refusal dated Jun. 26, 2025 in corresponding Japanese patent application No. 2024-120391 (9 pages; with English machine translation).

* cited by examiner

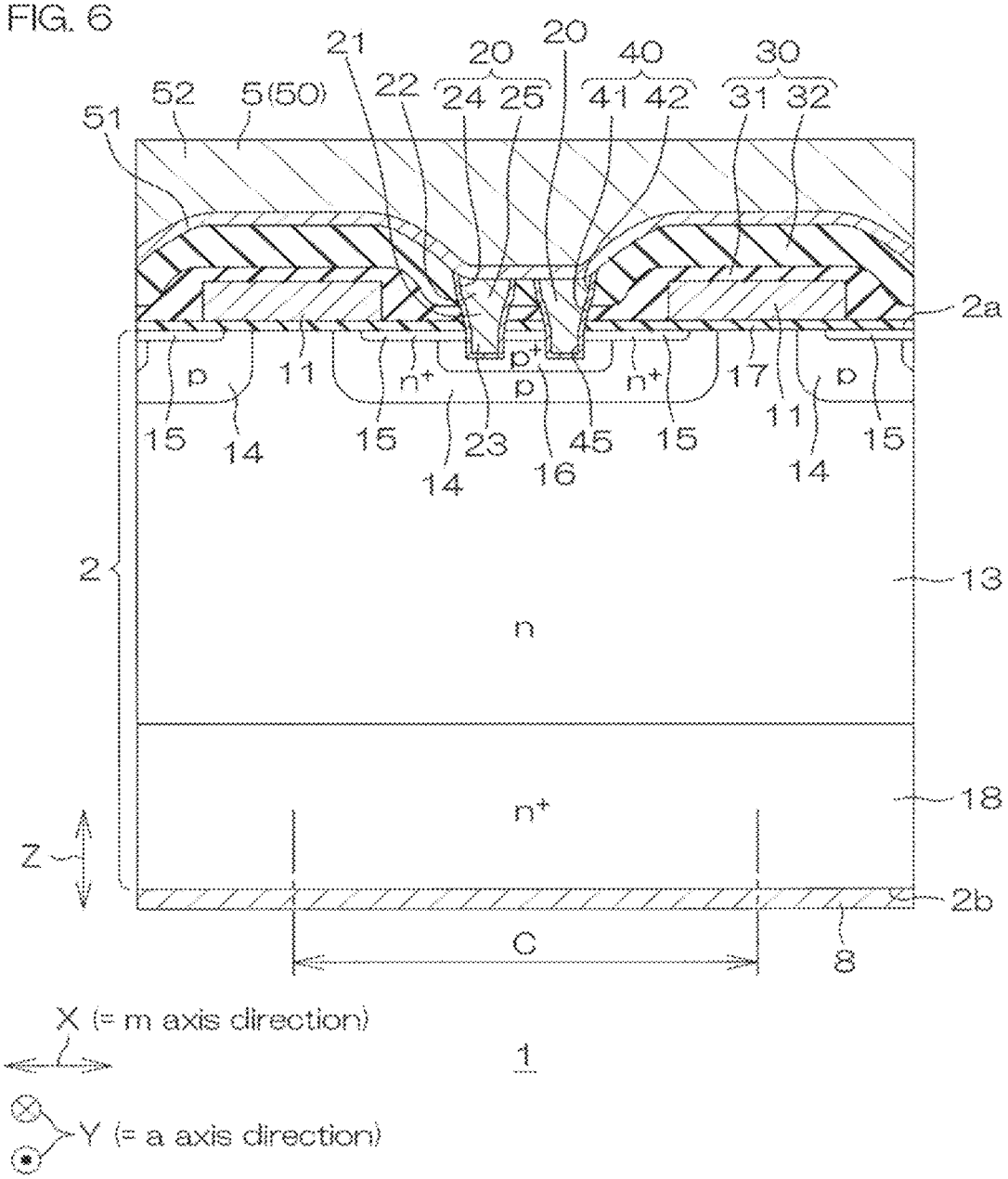

SEMICONDUCTOR DEVICE WITH CONTACT PLUGS

CROSS-REFERENCE TO RELATED APPLICATIONS

This application is a continuation of U.S. application Ser. No. 18/191,538, filed Mar. 28, 2023, which is a continuation of U.S. application Ser. No. 17/454,739, filed Nov. 12, 2021 (now U.S. Pat. No. 11,646,370), which is a continuation of U.S. application Ser. No. 16/886,198, filed May 28, 2020 (now U.S. Pat. No. 11,205,720), which claims the benefit of priority to Japanese Patent Application No. 2019-101621 filed on May 30, 2019 and Japanese Patent Application No. 2020-072389 filed on Apr. 14, 2020. The entire contents of these applications are hereby incorporated herein by reference.

BACKGROUND OF THE INVENTION

1. Field of the Invention

The present invention relates to a semiconductor device.

2. Description of the Related Art

WO 2016-159385 A1 discloses a semiconductor device provided with a planar gate type MOS gate structure on a main surface of an $n^-$-type semiconductor substrate. A p-type base region is provided in a front surface layer of the main surface of the semiconductor substrate. A pair of $n^+$-type source regions and a $p^+$-type contact region are provided in an interior of the p-type base region. The pair of $n^+$-type source regions are provided such as to sandwich the $p^+$-type contact region. On the main surface of the semiconductor substrate, a gate insulating film is provided and gate electrodes are provided on a front surface thereof. An interlayer insulating film is provided such as to cover the gate electrodes. A barrier metal film is provided such as to cover the interlayer insulating film. A contact opening that exposes the pair of $n^+$-type source regions and the $p^+$-type contact region is formed in the interlayer insulating film and the gate insulating film. The contact opening is arranged between the pair of gate electrodes provided in respective correspondence to the pair of $n^+$-type source regions. The barrier metal film contacts the pair of $n^+$-type source regions and the $p^+$-type contact region via the contact opening. A source electrode having aluminum as a main material is formed such as to cover the barrier metal film.

SUMMARY OF THE INVENTION

A preferred embodiment of the present invention provides a semiconductor device including a semiconductor layer that has a first main surface at one side and a second main surface at another side, a plurality of gate electrodes that are arranged at intervals on the first main surface of the semiconductor layer, an interlayer insulating film that is formed on the first main surface of the semiconductor layer such as to cover the gate electrodes, an electrode film that is formed on the interlayer insulating film, and a plurality of tungsten plugs that are arranged between a pair of mutually adjacent gate electrodes. The plurality of tungsten plugs are respectively embedded in a plurality of contact openings formed in the interlayer insulating film at intervals in a direction in which the pair of mutually adjacent gate electrodes face each other. Each tungsten plug has a bottom portion contacting the semiconductor layer and a top portion contacting the electrode film.

The aforementioned or other objects, features, and effects of the present invention will be clarified by the following description of preferred embodiments given below with reference to the accompanying drawings.

BRIEF DESCRIPTION OF THE DRAWINGS

FIG. 6 corresponds to FIG. 4 and is a sectional view for describing a structure in a case where a semiconductor layer constituted of an SiC monocrystal is applied in the semiconductor device.

DETAILED DESCRIPTION OF THE PREFERRED EMBODIMENTS

Figure 1:
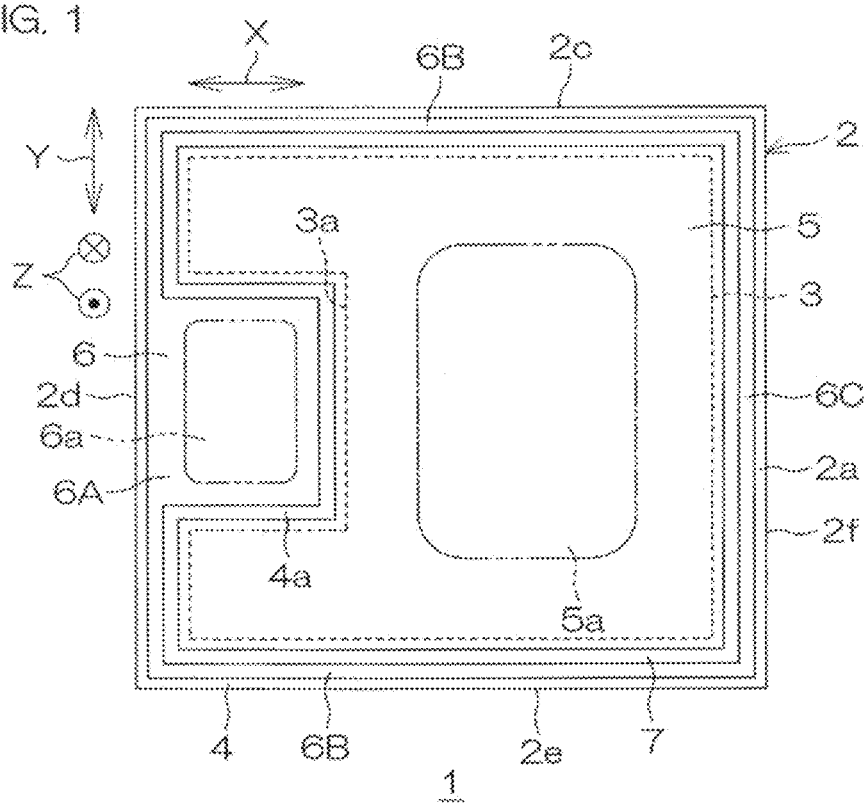
FIG. 1 is a plan view of a semiconductor device according to a preferred embodiment of the present invention.

By arranging unit cells that include gate electrodes on a semiconductor substrate at a high density, a channel width can be enlarged and an ON resistance can be reduced. For this purpose, intervals of the gate electrodes are narrowed. Since contact openings are narrowed in width correspondingly, an aspect ratio of the contact openings formed in an interlayer insulating film increases. The aspect ratio is defined, for example, by a ratio of depth with respect to width of the contact openings.

Aluminum, which is a typical electrode material, is not necessarily satisfactory in embedding property in an opening. Therefore, if an attempt is made to embed an aluminum electrode film in a contact opening of high aspect ratio, a void may form and contact resistance between a barrier metal and the electrode film may become high or contact failure may occur.

The present inventor thus considered using tungsten, which is a metal material of satisfactory embedding property in an opening. Specifically, a tungsten plug is embedded in a contact opening and an aluminum film is formed on an interlayer insulating film such as to contact the tungsten plug. The above problem can thereby be resolved.

However, it was found that adverse effects on a device occur due to stress of the tungsten plug embedded in the contact opening. Specifically, due to the stress of the tungsten plug, warping may occur in a semiconductor substrate, a film may become peeled, and device characteristics may change.

It is considered that this problem can be solved by making the contact opening small and making an area of the tungsten plug embedded in the contact opening small. However, such a solution accompanies a change in interval between gate electrodes and correspondingly, a layout of a body region, a source region, and a contact region must be changed. That is, an existing device design cannot be used at all and all masks for pattern forming need to be developed anew.

Thus, a preferred embodiment of the present invention provides a semiconductor device that is satisfactory in connection of electrodes and also satisfactory in device characteristics without changing a basic layout.

A preferred embodiment of the present invention provides a semiconductor device including a semiconductor layer that has a first main surface at one side and a second main surface at another side, a plurality of gate electrodes that are arranged at intervals on the first main surface of the semiconductor layer, an interlayer insulating film that is formed on the first main surface of the semiconductor layer such as to cover the gate electrodes, an electrode film that is formed on the interlayer insulating film, and a plurality of tungsten plugs that are arranged between a pair of mutually adjacent gate electrodes. The plurality of tungsten plugs are respectively embedded in a plurality of contact openings formed in the interlayer insulating film at intervals in a direction in which the pair of mutually adjacent gate electrodes face each other. Each tungsten plug has a bottom portion contacting the semiconductor layer and a top portion contacting the electrode film.

According to the present arrangement, the plurality of contact openings are formed in the interlayer insulating layer between the pair of gate electrodes and at intervals in the facing direction of the pair. The plurality of tungsten plugs are respectively embedded in the plurality of contact openings. The tungsten plugs have a satisfactory embedding property with respect to the contact openings. Therefore, even if the intervals between the gate electrodes are narrow and the contact openings are small correspondingly, the bottom portions of the tungsten plugs contact the semiconductor layer satisfactorily and contact failure therebetween can thus be suppressed or prevented.

On the other hand, the plurality of tungsten plugs are respectively embedded in the plurality of contact openings that are dispersedly arranged between the pair of gate electrodes and therefore, stress of the tungsten plugs is small. Problems in terms of process that are due to the stress of the tungsten plugs can thus be avoided and failure of device characteristics can be suppressed or prevented. Also, due to being an arrangement where the plurality of tungsten plugs are dispersedly arranged between the gate electrodes, there is no need to narrow the interval of the gate electrodes. Change of a basic layout is thus not required.

The top portions of the tungsten plugs contact the electrode film formed on the interlayer insulating film. The electrode film is thus electrically connected via the tungsten plugs to the semiconductor layer.

The electrode film may be arranged using a metal material that is lower in embedding property with respect to the contact openings than tungsten (for example, a metal material having aluminum as a main component). The electrode film is preferably constituted of a metal material of lower stress than tungsten. Degradation of device characteristics due to stress of the electrode film can thereby be suppressed or prevented.

Hereinafter, preferred embodiments of the present invention will be described in detail with reference to the attached drawings.

FIG. 1 is a plan view of a semiconductor device 1 according to a preferred embodiment of the present invention. In the present preferred embodiment, the semiconductor device 1 is an electronic component that has a MISFET (metal-insulator-semiconductor field effect transistor).

The semiconductor device 1 includes a semiconductor layer 2 of chip shape. Specifically, the semiconductor layer 2 has a first main surface 2a at one side and a second main surface 2b at another side (see FIG. 4). The first main surface 2a and the second main surface 2b are both flat surfaces. In FIG. 1 is shown an arrangement of the semiconductor device 1 in a plan view as viewed from a direction perpendicular to the first main surface 2a. In the present preferred embodiment, the first main surface 2a and the second main surface 2b are of quadrilateral shapes and more specifically of rectangular shapes. The semiconductor layer 2 has side surfaces 2c, 2d, 2e, and 2f (four flat side surfaces in the present preferred embodiment) that connect the first main surface 2a and the second main surface 2b.

In the description that follows, for convenience, a direction perpendicular to the first main surface 2a and the second main surface 2b, that is, a direction parallel to a normal to the first main surface 2a and the second main surface 2b shall be referred to as the "normal direction Z" of the semiconductor layer 2. Also, to view from the normal direction Z shall be referred to as "plan view." Further, for convenience, a direction perpendicular to the normal direction Z and parallel to one side surface 2c shall be referred to as the "first direction X" and a direction perpendicular to both the normal direction Z and the first direction X (a direction parallel to another side surface 2d adjacent to the side surface 2c) shall be referred to as the "second direction Y."

The semiconductor layer 2 includes an active region 3 and an outer region 4 (peripheral region). The active region 3 and the outer region 4 are set on the first main surface 2a of the semiconductor layer 2.

The active region 3 is set, in plan view, in a central portion of the semiconductor layer 2 across intervals inward from the side surfaces 2c to 2f of the semiconductor layer 2. The active region 3 may be set to a quadrilateral shape (more specifically, a rectangular shape) having four sides respectively parallel to the four side surfaces 2c to 2f of the semiconductor layer 2 in plan view. In the present preferred embodiment, the active region 3 has a recess 3a that is recessed inwardly from a vicinity of a central portion of one side of the rectangle.

The outer region 4 is a region outside the active region 3. The outer region 4 extends as a band along peripheral edges of the active region 3 in plan view. The outer region 4 surrounds the active region 3 in plan view. More specifically, the outer region 4 is set to an endless shape (quadrilateral annular shape) that surrounds the active region 3 in plan view. In the present preferred embodiment, the outer region 4 has a projection 4a projecting inwardly toward the active region 3 such as to match the recess 3a of the active region 3.

A source terminal electrode 5 of film shape is arranged such as to cover substantially an entirety of the active region 3. A source pad region 5a is set in a central portion of the source terminal electrode 5. The source pad region 5a provides a bonding pad to which a bonding wire is bonded.

A gate terminal electrode 6 of film shape is arranged in the outer region 4. The gate terminal electrode 6 and the source terminal electrode 5 are isolated from each other by an interval 7 (an interval of slit shape in the present preferred embodiment) and are thereby electrically insulated. The gate terminal electrode 6 includes a gate pad portion 6A arranged such as to match the projection 4a of the outer region 4 and gate wirings 6B extending from the gate pad portion 6A. The gate wirings 6B are also called gate fingers.

In the present preferred embodiment, the gate pad portion 6A is formed to a rectangular shape in plan view. A gate pad region 6a is set in a central portion of the gate pad portion 6A. The gate pad region 6a provides a bonding pad to which a bonding wire is bonded.

The gate wirings 6B extend as bands along the outer region 4. In the present preferred embodiment, two gate wirings 6B are joined to the gate pad portion 6A. Each gate wiring 6B extends along one side surface 2d of the semiconductor layer 2 and further bends such as to be oriented another side surface 2c or 2e adjacent to the side surface 2d to be formed to an L shape in plan view. Tip portions of the two gate wirings 6B are connected to each other by a coupling gate wiring 6C. The coupling gate wiring 6C extends along the side surface 2f. The gate wirings 6B and 6C can thus be said to constitute a single gate wiring of a mode that annularly surrounds the active region 3.

Figure 2:
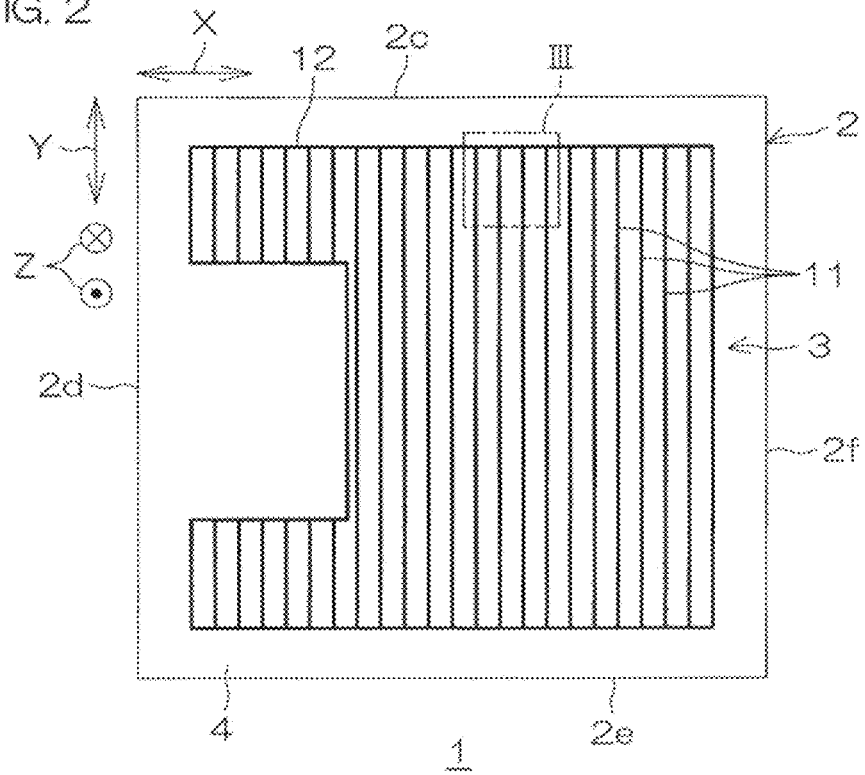
FIG. 2 is an illustrative plan view for describing an internal wiring structure connected to gate wirings.

FIG. 2 is an illustrative plan view for describing an internal wiring structure connected to the gate wirings 6B and 6C. In the present preferred embodiment, a planar gate structure is formed on the first main surface 2a of the semiconductor layer 2. A plurality of gate electrodes 11 of the planar gate structure and an outer gate electrode 12 that joins the plurality of electrodes 11 to each other are shown in FIG. 2.

The plurality of gate electrodes 11 are formed on the first main surface 2a. Each gate electrode 11, for example, extends in a line shape along the second direction Y. The plurality of gate electrodes 11 are laid out in parallel at intervals in the first direction X. Both end portions of each gate electrode 11 are joined and connected to the outer gate electrode 12. The outer gate electrode 12 is arranged in the outer region 4 along an outer periphery of the active region 3. The outer gate electrode 12 is formed to an annular pattern matching the shapes of the gate wirings 6B and 6C in the present preferred embodiment. The gate electrodes 11 and the outer gate electrode 12 may be formed integrally, for example, by a polysilicon film formed on the first main surface 2a.

Figure 3:
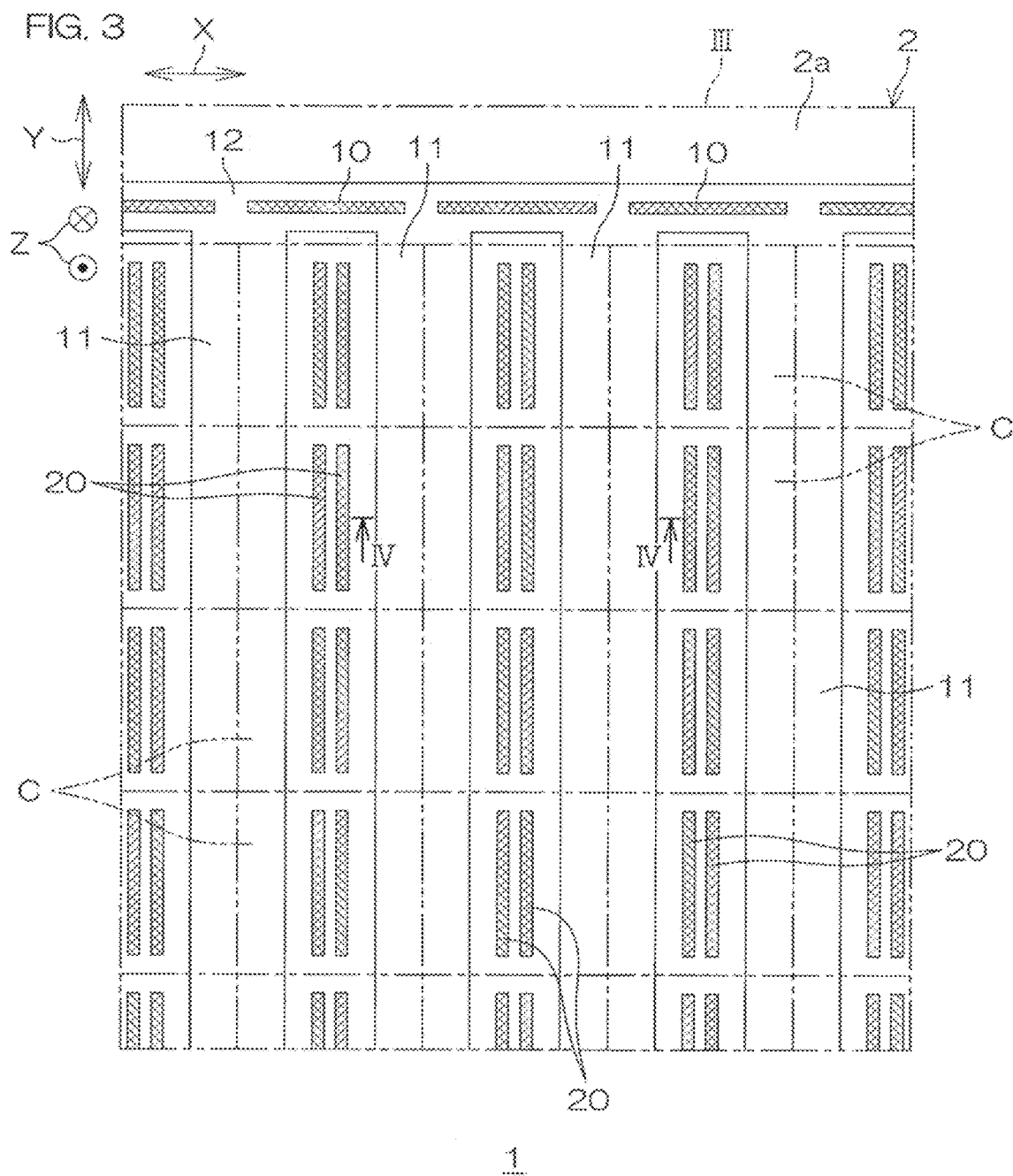
FIG. 3 is an enlarged plan view of a region III in FIG. 2.

FIG. 3 is an enlarged plan view of a region III in FIG. 2. On the first main surface 2a of the semiconductor layer 2, a plurality of unit cell regions C are set inside the active region 3. The plurality of unit cell regions C are laid out in an array. That is, in the present preferred embodiment, the plurality of unit cell regions C are laid out in a matrix in the first direction X and the second direction Y. That is, a plurality of the unit cell regions C are laid out in the first direction X. Also, a plurality of the unit cell regions C are laid out in the second direction Y. In each unit cell region C, a gate electrode 11 passes through in the second direction Y. The plurality of unit cell regions C laid out in the second direction Y share the same gate electrode 11.

In the present Specification, for convenience, the unit cell regions C of substantially square shapes are defined by setting boundaries of the unit cell regions C at intermediate positions of the gate electrodes 11 in regard to the first direction X and setting boundaries of the unit cell regions C at a plurality of positions in regard to the second direction Y. However, the definition of the unit cell regions C is not restricted to this. For example, the plurality of unit cell regions C aligned in the second direction Y in accordance with the above definition may be collectively defined as one unit cell region.

Source contacts 20 are provided between each pair of gate electrodes 11 that are mutually adjacent in the first direction X. Although details shall be described later, in the present preferred embodiment, each source contact 20 is constituted of a tungsten plug. Therefore, in the following, the source contacts 20 are referred to in some cases as the "tungsten plugs 20."

The source contacts 20 connect the source terminal electrode 5 (see FIG. 1) to the semiconductor layer 2. In the present preferred embodiment, a plurality (more specifically two) of the source contacts 20 are arranged at an interval in the first direction X between each pair of gate electrodes 11 that are mutually adjacent in the first direction X. In other words, two source contacts 20 are arranged at an interval in the first direction X at an intermediate portion of each unit cell region C in regard to the first direction X. Each source contact 20 extends along the gate electrodes 11, that is, along the second direction Y. In the present preferred embodiment, the source contact 20 is formed as a band. More specifically, the source contact 20 is formed to a rectangular shape that extends rectilinearly along the gate electrodes 11. The plurality (two in the present preferred embodiment) of source contacts 20 are parallel to each other.

Respective ends of each source contact 20 are positioned in vicinities of boundaries in regard to the second direction Y inside a unit cell region C. A length of the source contact 20 in the second direction Y is thus shorter than a length of the gate electrodes 11.

The unit cell regions C are laid out along the second direction Y and correspondingly, a plurality of the source contacts 20 are laid out along the second direction Y. That is, in a region between each pair of gate electrodes 11 that are adjacent each other, the plurality of source contacts 20 are laid out at an interval in the first direction X and at intervals in the second direction Y. In other words, between each pair of gate electrodes 11 that are adjacent each other, the plurality of source contacts 20 are laid out in an array (in the present preferred embodiment, in a matrix along the first direction X and the second direction Y).

If the plurality of source contacts 20 that are aligned along a long direction of the gate electrode 11, that is, along the second direction Y are to be collectively referred to as a source contact, it may also be deemed that the source contact is divided into a plurality of source contact segments in regard to the second direction Y. Also, if a plurality of the source contacts that are aligned along a direction intersecting the gate electrodes 11 and oriented along the first main surface 2a, that is, along the first direction X are to be collectively referred to as a source contact, it may also be deemed that the source contact is partitioned into a plurality of source contact segments in regard to the first direction X. Therefore, with the present preferred embodiment, it may be deemed that a source contact arranged between each pair of gate electrodes 11 has a plurality of source contact segments that are respectively laid out at intervals in the first direction X and the second direction Y. To further put it in another way, the source contact arranged between each pair of gate electrodes 11 has the plurality of source contact segments that are laid out in an array (in the present preferred embodiment, in a matrix along the first direction X and the second direction Y).

Gate contacts 10 are arranged on the outer gate electrode 12. In the present preferred embodiment, a plurality of the gate contacts 10 are provided. The plurality of gate contacts 10 are arranged at intervals in a long direction of the outer gate electrode 12. Each gate contact 10 is formed as a band that extends in the long direction of the outer gate electrode 12. In the present preferred embodiment, each gate contact 10 is of a rectangular shape having a long side parallel to the long direction of the outer gate electrode 12. In the present preferred embodiment, the gate contacts 10 are constituted of tungsten plugs as are the source contacts 20.

A width of the gate contacts 10 is practically equal to a width of the source contacts 20. The width of the gate contacts 10 refers to a length orthogonal to a long direction of each gate contact 10. The width of the source contacts 20 refers to a length orthogonal to a long direction of each source contact 20 (source contact segment).

Figure 4:
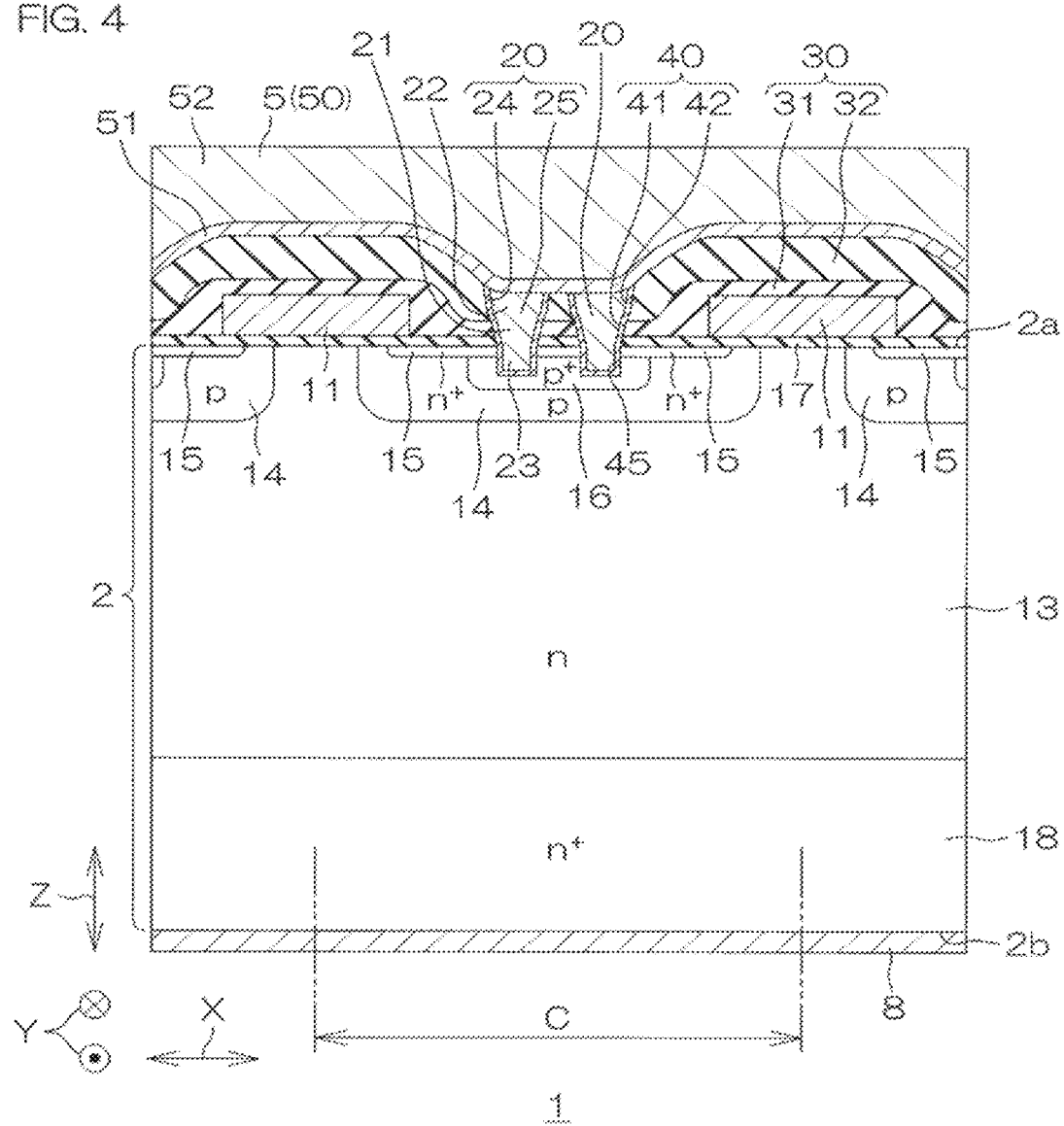
FIG. 4 is a sectional view of a specific arrangement example of a unit cell region and shows a cross-sectional structure along line IV-IV of FIG. 3.

FIG. 4 is a sectional view of a specific arrangement example of a unit cell region and shows a cross-sectional structure along line IV-IV of FIG. 3. A main portion of the semiconductor layer 2 provides an n$^-$-type drift region 13. p-type body regions 14 are formed in a surface layer portion of the first main surface 2a of the semiconductor layer 2. The body regions 14 extend as bands along the second direction Y. n$^+$-type source regions 15 are formed on front surfaces of the body regions 14. The source regions 15 extend as bands along the second direction Y. The source regions 15 are exposed on the first main surface 2a. At the first main surface 2a, a peripheral edge of each source region 15 is positioned inward across intervals from a peripheral edge of a body region 14 and between these, the body region 14 is exposed on the first main surface 2a. p$^+$-type contact regions 16 are provided directly below the source regions 15. The contact regions 16 extend as bands along the second direction Y. In plan view, the contact regions 16 are positioned at inner sides of the source regions 15.

A gate insulating film 17 is formed on the first main surface 2a. In the present preferred embodiment, the gate insulating film 17 includes a silicon oxide film. The gate insulating film 17 may include a nitride silicon film in place of or in addition to the silicon oxide film.

The gate electrodes 11 are formed on the gate insulating film 17. The gate electrodes 11 face the first main surface 2a via the gate insulating film 17. More specifically, each gate electrode 11 is arranged such as to face a region of the first main surface 2a extending across source regions 15, body regions 14, and the drift region 13. One gate electrode 11 faces the first main surface 2a in a vicinity of an edge portion of a body region 14 at one side in the first direction X. Another gate electrode 11 faces the first main surface 2a in a vicinity of an edge portion of the body region 14 at another side in the first direction X. Each pair of gate electrodes 11 that are adjacent each other in the first direction X thus share one body region 14. It can also be said that each pair of body regions 14 that are adjacent each other in the first direction X share one gate electrode 11.

The gate electrodes 11 are covered by an interlayer insulating film 30. The interlayer insulating film 30 covers the gate electrodes 11 and covers the gate insulating film 17 at regions between the gate electrodes 11. In the present preferred embodiment, the interlayer insulating film 30 includes a first interlayer insulating film 31 and a second interlayer insulating film 32 laminated on the first interlayer insulating film 31. The first interlayer insulating film 31 may, for example, be a film constituted of USG (undoped silicate glass), that is, silicon oxide that contains neither phosphorus nor boron (an example of a first insulating material). The second interlayer insulating film 32 may, for example, be a film constituted of BPSG (boro-phospho silicate glass), that is, silicon oxide that contains phosphorus and boron (an example of a second insulating material).

In the interlayer insulating film 30, a plurality of contact openings 40 are formed in the region between each pair of gate electrodes 11, that is, directly above each body region 14. The plurality of contact openings 40 penetrate through the interlayer insulating film 30 and the gate insulating film 17. The plurality of contact openings 40 are arranged at an interval in a direction in which the pair of gate electrodes 11 face each other, that is, in the first direction X. Configuration and shapes of the contact openings 40 in plan view are in accordance with the configuration and shapes of the source contacts 20 described above. That is, the contact openings 40 extend as bands along the second direction Y.

Each contact opening 40 includes a first opening 41 formed in the first interlayer insulating film 31 and a second opening 42 formed in the second interlayer insulating film 32. The first opening 41 and the second opening 42 are in communication with each other. An opening width of the second opening 42 is larger than an opening width of the first opening 41. The opening widths refer to widths of the openings at upper surfaces (surfaces at sides further from the first main surface 2a) of the respective interlayer insulating films 31 and 32 and, here, refer to widths along the first direction X.

Each contact opening 40 may have a tapered cross section that narrows toward the first main surface 2a. More specifically, the first opening 41 may have a tapered cross section that narrows toward the first main surface 2a. The second opening 42 may have a tapered cross section that narrows toward the first main surface 2a. An inclination angle of a side wall of the second opening 42 with respect to the normal direction Z of the first main surface 2a may be greater than an inclination angle of a side wall of the first opening 41 with respect to the normal direction Z of the first main surface 2a.

In the first main surface 2a are formed trenches 45 matching the contact openings 40 and being in communication with the contact openings 40. The trenches 45 are an example of recesses formed in the first main surface 2a of the semiconductor layer 2. Each trench 45 penetrates through the source region 15 and reaches the contact region 16. That is, the source region 15 is exposed at a side wall of the trench 45 and the contact region 16 is exposed at a bottom portion of the trench 45. In the present preferred embodiment, the contact region 16 is also exposed at the side wall close to the bottom portion of the trench 45.

A tungsten plug 20 is embedded in a space demarcated by each contact opening 40 and trench 45. The tungsten plug 20 includes a barrier metal layer 24 and a tungsten layer 25. The barrier metal layer 24 is a thin metal layer formed such as to cover inner surfaces of the contact opening 40 and the trench 45. The barrier metal layer 24 inwardly demarcates a space of groove shape corresponding to shapes of the contact opening 40 and the trench 45. The tungsten layer 25 is embedded in this space. The barrier metal layer 24 mainly suppresses or prevents a constituent material of the tungsten layer 25, that is, tungsten from diffusing to the interlayer insulating film 30. The barrier metal layer 24 contains, for example, one of either or both of Ti and TiN. The barrier metal layer 24 may be a laminated film in which a Ti film and a TiN film are laminated.

The tungsten plugs 20 are embedded in the contact openings 40 and are thus provided in the same configuration as the contact openings 40. That is, a plurality of the tungsten plugs 20 are arranged in the region between each pair of gate electrodes 11, that is, directly above each body region 14. The plurality of tungsten plugs 20 penetrate through the interlayer insulating film 30. The plurality of tungsten plugs 20 are arranged at intervals in the direction in which the pair of gate electrodes 11 face each other, that is, in the first direction X.

Configuration and shapes of the tungsten plugs 20 in plan view are in accordance with the configuration and shapes of the source contacts 20 described above. In other words, the tungsten plugs 20 constitute the source contacts 20. That is, in the above description related to the configuration of the source contacts 20, "source contact" can be replaced by "tungsten plug."

Each tungsten plug 20 has a first portion 21 arranged at the first opening 41 of the first interlayer insulating film 31, a second portion 22 arranged at the second opening 42 of the second interlayer insulating film 32 (and the corresponding opening in the gate insulating film 17), and a third portion 23 arranged inside the trench 45. The first, second, and third portions 21, 22, and 23 are continuous to each other. A width of the second portion 22 is greater than a width of the first portion 21. The widths refer to widths at upper ends (ends at sides further from the first main surface 2a) of the respective portions and, here, refer to widths along the first direction X and are practically the same as the opening widths of the contact opening 40. The tungsten plug 20 may have a tapered cross section that narrows toward the first main surface 2a. More specifically, the first portion 21 may have a tapered cross section that narrows toward the first main surface 2a. The second portion 22 may have a tapered cross section that narrows toward the first main surface 2a. An inclination angle of a side wall of the second portion 22 with respect to the normal direction Z of the first main surface 2a may be greater than an inclination angle of a side wall of the first portion 21 with respect to the normal direction Z of the first main surface 2a. The inclination angles refer to angles formed with respect to the normal direction Z.

The third portion 23, that is, a bottom portion of each tungsten plug 20 is embedded inside the trench 45 and contacts the semiconductor layer 2. Specifically, the third portion 23 (bottom portion) contacts the source region 15 and the contact region 16. The tungsten plug 20 is thereby electrically connected to the source region 15 and electrically connected to the body region 14 via the contact region 16.

An electrode film 50 that constitutes the source terminal electrode 5 is formed such as to cover the interlayer insulating film 30. The electrode film 50 includes a barrier metal layer 51 and a main electrode layer 52 laminated on the barrier metal layer 51.

The main electrode layer 52 is a metal layer having aluminum as a main component. Specifically, the main electrode layer 52 may contain at least one type of material among aluminum, copper, Al—Si—Cu (aluminum-silicon-copper) alloy, Al—Si (aluminum-silicon) alloy, or Al—Cu (aluminum-copper) alloy. The main electrode layer 52 may have a single layer structure that contains one type of material among the above conductive materials. The main electrode layer 52 may have a laminated structure in which at least two types of material among the above conductive materials are laminated in any order.

The barrier metal layer 51 mainly suppresses or prevents a constituent material of the main electrode layer 52, mainly aluminum, from diffusing to the interlayer insulating film 30. The barrier metal layer 51 contains, for example, one of either or both of Ti and TiN. The barrier metal layer 51 may be a laminated film in which a Ti film and a TiN film are laminated.

The electrode film 50 contacts top surfaces of the tungsten plugs 20 exposed at the contact openings 40. The electrode film 50 is thereby electrically connected to the source regions 15 via the tungsten plugs 20. Also, the electrode film 50 is electrically connected to the body regions 14 via the tungsten plugs 20 and the contact regions 16.

The semiconductor layer 2 has an $n^+$-type drain region 18 at the second main surface 2b side. An exposed surface of the drain region 18 forms the second main surface 2b. A drain terminal electrode 8 is formed on the second main surface 2b.

When in a state where an appropriate voltage is applied across the source terminal electrode 5 and the drain terminal electrode 8, a control voltage not less than a threshold voltage is applied to the gate electrodes 11, inversion layers appear at front surfaces (channel regions) of the body regions 14 directly below the gate electrodes 11. The inversion layers provide channels that connect the source regions 15 and the drift region 13 and the source terminal electrode 5 and the drain terminal electrode 8 are thereby made conductive to each other. When the control voltage is removed, the channels disappear and the source/drain interval is interrupted.

Figure 5A:
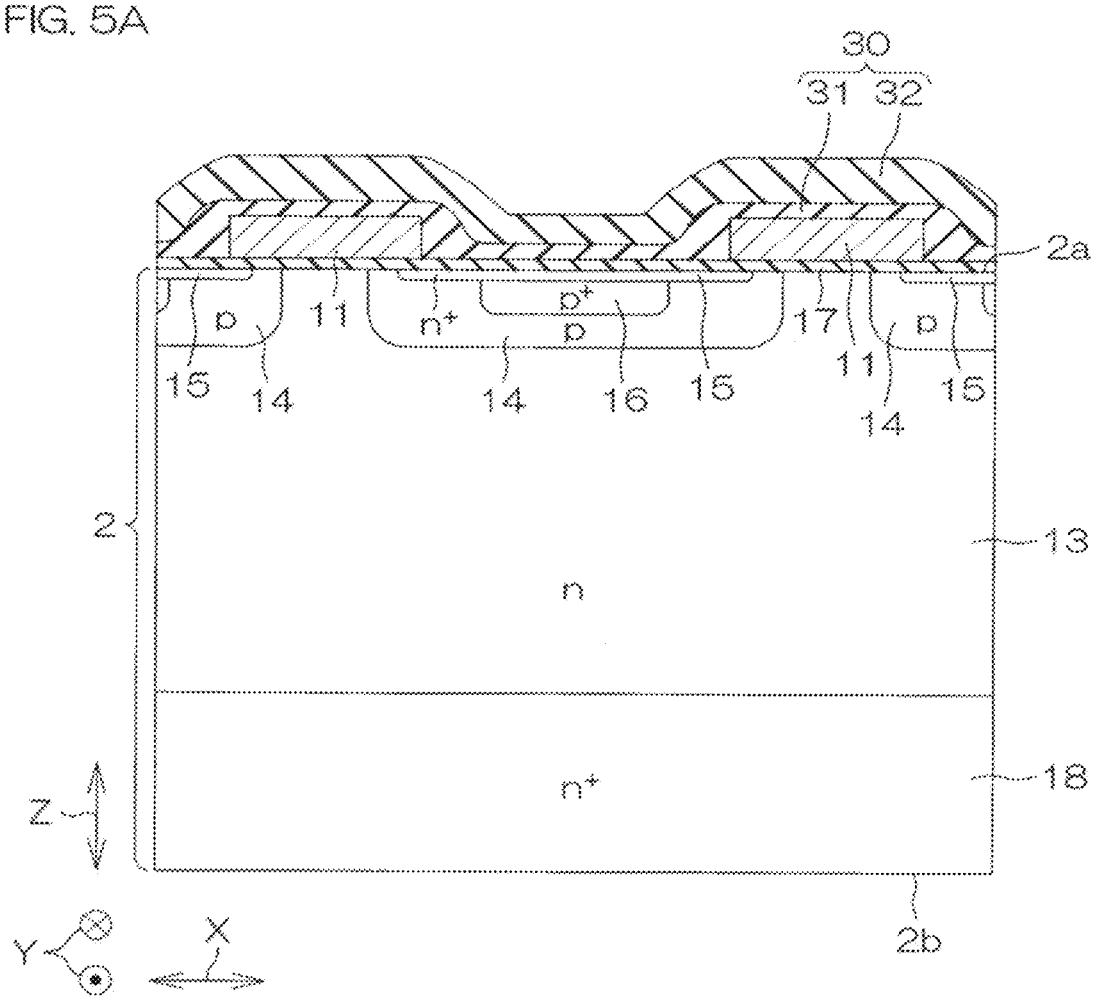
FIG. 5A to FIG. 5D are sectional views for describing a manufacturing process of the semiconductor device.

FIG. 5A to FIG. 5D are sectional views for describing a manufacturing process of the semiconductor device 1. The body regions 14, the source regions 15, the contact regions 16, and the drain region 18 are formed by known processes, such as diffusion of an impurity into a semiconductor substrate, etc., and further, the gate insulating film 17 is formed on the front surface of the semiconductor layer 2. Further, by forming and patterning of a conductive polysilicon film added with an impurity (phosphorus, etc.), the gate electrodes 11 and the outer gate electrode 12 are formed on the first main surface 2a of the semiconductor layer 2. The first interlayer insulating film 31 and the second interlayer insulating film 32 are then formed, for example, by a plasma CVD method (chemical vapor deposition method). Thereafter, a heat treatment (annealing) is performed to achieve flattening of the interlayer insulating film 30. This state is shown in FIG. 5A.

Figure 5B:
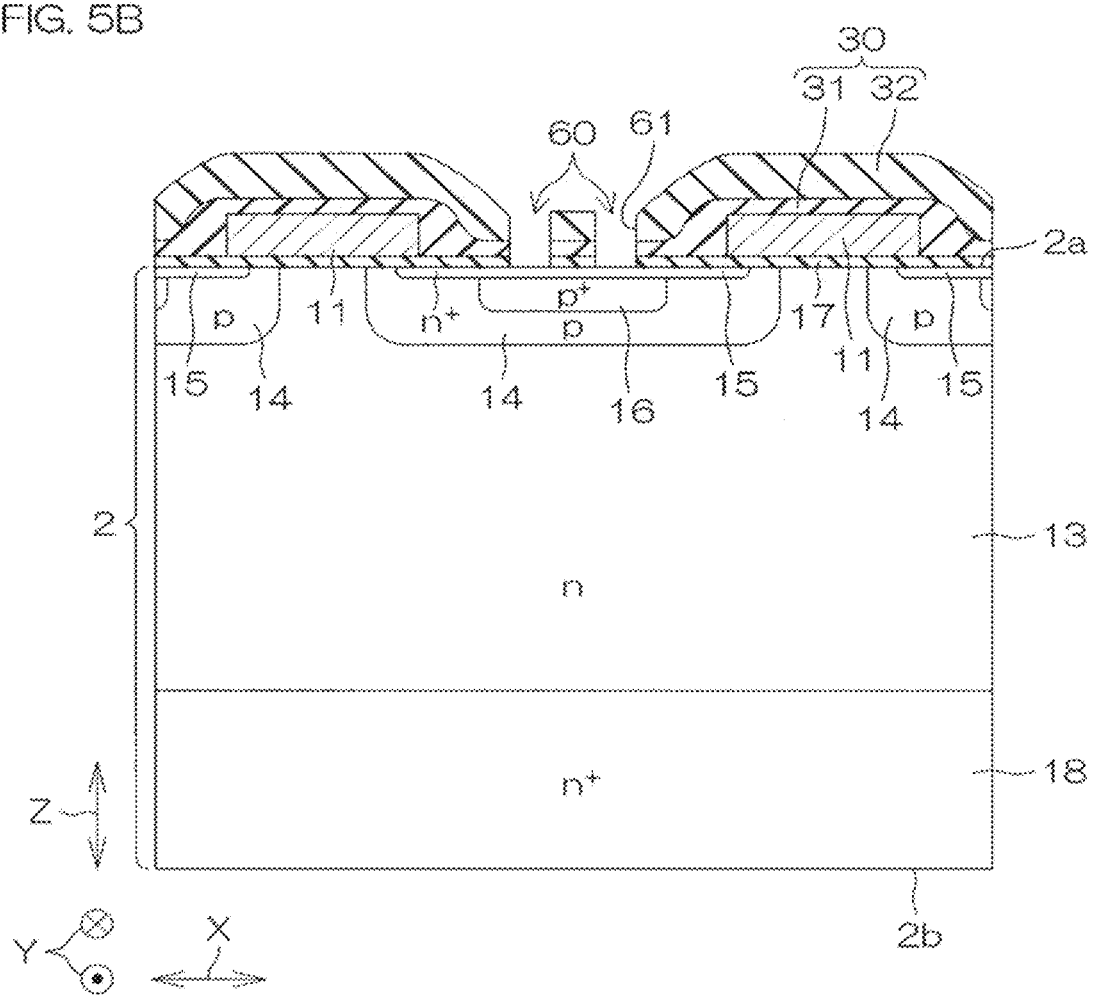

Next, openings 60 that penetrate through the interlayer insulating film 30 and the gate insulating film 17 are formed by dry etching (for example, RIE: reactive ion etching) via a resist mask (not shown). Thereafter, the resist mask is removed. This state is shown in FIG. 5B. The dry etching is performed, for example, under conditions of anisotropically etching a material (for example, silicon oxide) of the interlayer insulating film 30 and the gate insulating film 17. The openings thus have inner side surfaces 61 that are substantially perpendicular to the first main surface 2a.

Figure 5C:
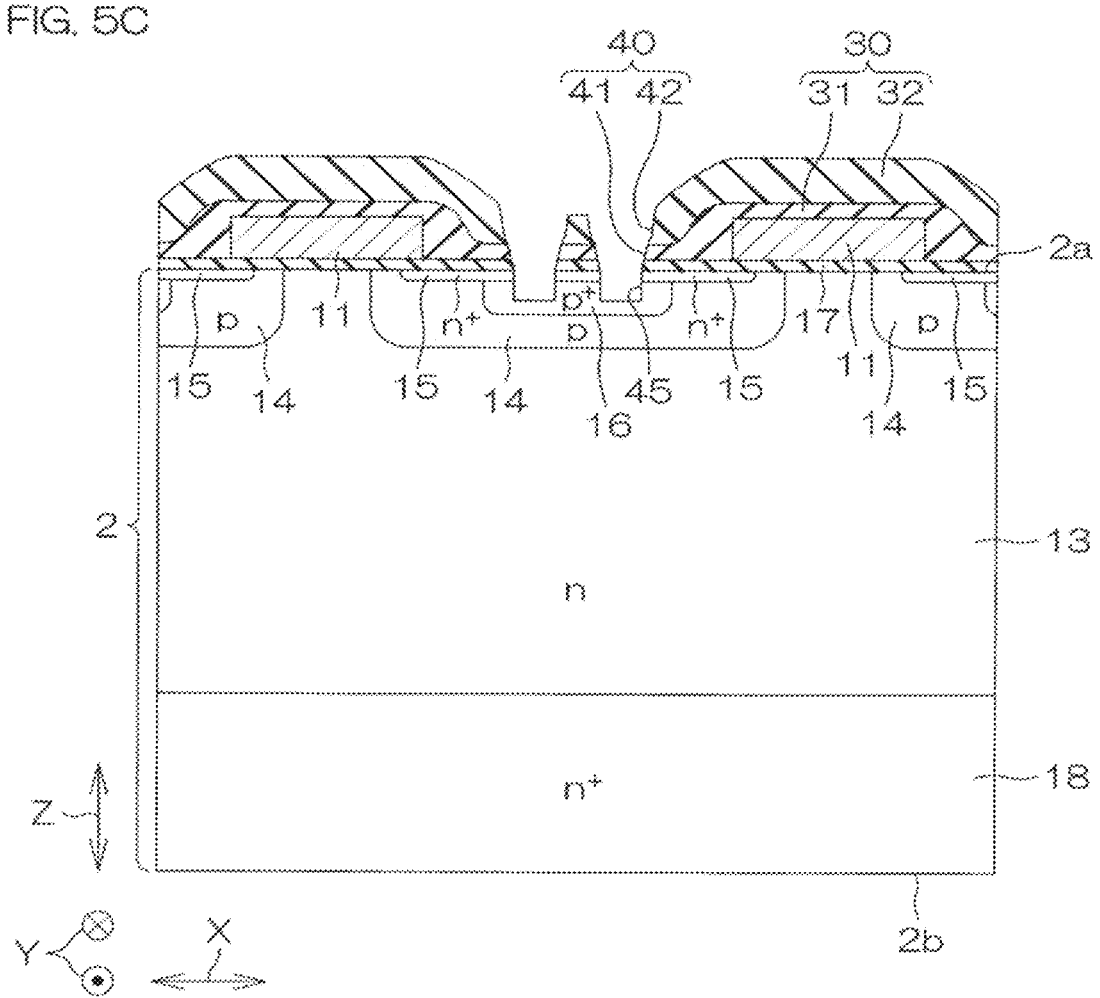

Next, the trenches 45 are formed in the first main surface 2a of the semiconductor layer 2 by dry etching (for example, RIE) using the interlayer insulating film 30 as a mask. This state is shown in FIG. 5C. The dry etching is performed under conditions of anisotropically etching a material (for example, silicon) of the semiconductor layer 2. The trenches 45 thus have inner side surfaces 46 that are substantially perpendicular to the first main surface 2a. Meanwhile, at the interlayer insulating film 30, the etching progresses in a lateral direction (direction parallel to the first main surface 2a) and therefore, the openings 60 are widened.

The first interlayer insulating film 31 and the second interlayer insulating film 32 differ in material and therefore differ in rate of the etching in the lateral direction. Correspondingly, the opening widths differ at the first interlayer insulating film 31 and the second interlayer insulating film 32 and the inclination angles at the inner side surfaces differ. Specifically, the opening width of the second openings 42 formed in the second interlayer insulating film 32 become larger than the opening width of the first openings 41 formed in the first interlayer insulating film 31. Also, the inclination angle of the inner side surfaces of the second openings 42 becomes greater than the inclination angle of the inner side surfaces of the first openings 41. Here, the "inclination angle" refers to an angle that an inner side surface forms with respect to the normal direction Z of the first main surface 2a.

Figure 5D:
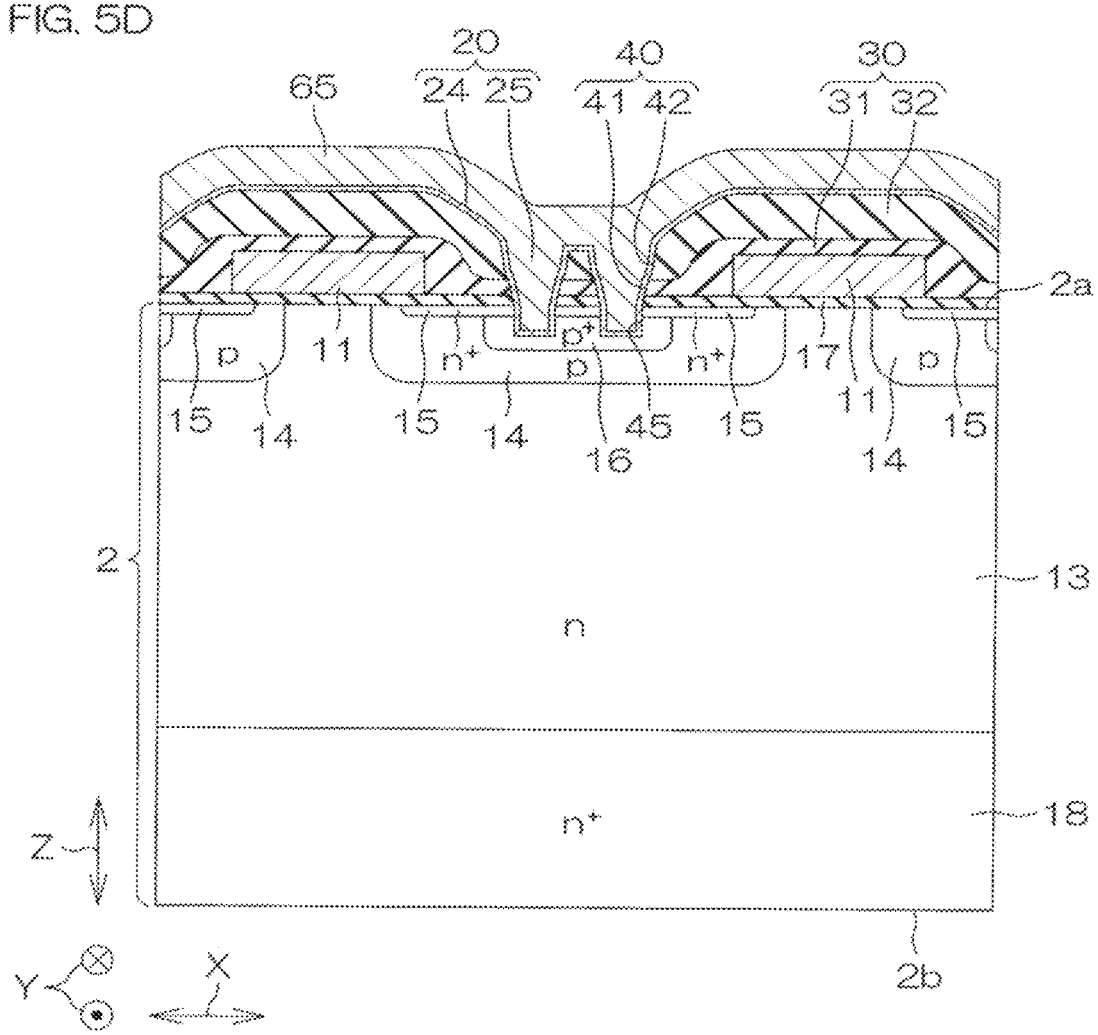

Next, the barrier metal layer 24 is formed, for example, by a CVD method. Further, a tungsten film 65 is formed, for example, by a CVD method. The tungsten film 65 enters inside the contact openings 40 via the barrier metal layer 24 and becomes embedded in the trenches 45 formed in the semiconductor layer 2. This state is shown in FIG. 5D.

Next, the tungsten film 65 is etched back and the tungsten film 65 on the interlayer insulating film 30 outside the contact openings 40 is removed. The tungsten plugs 20 embedded inside the contact openings 40 are thereby obtained.

Thereafter, the barrier metal layer 51 that covers front surfaces of the interlayer insulating film 30 and the tungsten plugs 20 is formed, for example, by sputtering. Further, by the main electrode layer 52 being formed, for example, by sputtering on the barrier metal layer 51, the electrode film 50 is formed. The electrode film 50 is separated into the gate terminal electrode 6 and the source terminal electrode 5.

Also, an electrode film 50 is also formed as the drain terminal electrode 8 on the second main surface 2b of the semiconductor layer 2. The arrangement of FIG. 4 is thereby obtained.

A passivation film (not shown) is formed as necessary on a front surface of the electrode film 50. Openings that expose the pad regions of the gate terminal electrode 6 and the source terminal electrode 5 are formed in the passivation film.

As was described with reference to FIG. 3, the gate contacts 10 have a width that is substantially equal to that of the source contacts 20. The arrangement of the gate contacts 10 is practically the same as the arrangement of the source contacts 20. That is, the gate contacts 10 are constituted of the tungsten plugs that are embedded in the interlayer insulating film 30. More specifically, contact openings are formed in the interlayer insulating film 30 directly above the outer gate electrode 12. The contact openings are formed in the same step as the contact openings 40 for the source contact 20 and penetrate through the interlayer insulating film 30 to reach the outer gate electrode 12. In the same step as that in which the tungsten plugs 20 for the source contacts 20 are formed, the tungsten plugs for the gate contacts 10 are embedded in the interlayer insulating film 30 directly above the outer gate electrode 12. Each of the tungsten plugs has a top portion contacting a gate terminal electrode 6 region of the electrode film 50 and a bottom portion contacting the outer gate electrode 12.

As described above, the semiconductor device 1 of the present preferred embodiment includes the semiconductor layer 2 that has the first main surface 2a at one side and the second main surface 2b at the other side, the plurality of gate electrodes 11 that are arranged at intervals on the first main surface 2a of the semiconductor layer 2, the interlayer insulating film 30 that is formed on the first main surface 2a of the semiconductor layer 2 such as to cover the gate electrodes 11, the electrode film 50 that is formed on the interlayer insulating film 30, and the plurality of tungsten plugs 20 that are arranged between each pair of mutually adjacent gate electrodes 11. The plurality of tungsten plugs 20 are respectively embedded in the plurality of contact openings 40 formed in the interlayer insulating film 30 at intervals in the direction in which the pair of mutually adjacent gate electrodes 11 face each other. Each tungsten plug 20 has the bottom portion contacting the semiconductor layer 2 and the top portion contacting the electrode film 50.

According to the present arrangement, the plurality of contact openings 40 are formed in the interlayer insulating layer 30 between the pair of gate electrodes 11 and at intervals in the facing direction of the pair. The plurality of tungsten plugs 20 are respectively embedded in the plurality of contact openings 40. The tungsten plugs 20 have a satisfactory embedding property with respect to the contact openings 40. Therefore, even if the intervals between the gate electrodes 11 are narrow and the contact openings 40 are small correspondingly, the bottom portions of the tungsten plugs 20 contact the semiconductor layer 2 satisfactorily and contact failure therebetween can thus be suppressed or prevented.

On the other hand, the plurality of tungsten plugs 20 are respectively embedded in the plurality of contact openings 40 that are dispersedly arranged between the pair of gate electrodes 11 and therefore, stress of the tungsten plugs 20 is small. Problems in terms of process that are due to the stress of the tungsten plugs 20 can thus be avoided and failure of device characteristics can be suppressed or prevented. Also, due to being an arrangement where the plurality of tungsten plugs 20 are dispersedly arranged between the gate electrodes 11, there is no need to narrow the interval of the gate electrodes 11. Change of a basic layout is thus not required. Also, warping of a substrate and other problems due to the stress of the tungsten plugs 20 can be avoided, thus also making possible application to thin wafer processes.

The top portions of the tungsten plugs 20 contact the electrode film 50 formed on the interlayer insulating film 30. The electrode film 50 is thus electrically connected via the tungsten plugs 20 to the semiconductor layer 2.

The semiconductor device 1 that is satisfactory in connection of the electrodes and also satisfactory in device characteristics can thus be provided without changing the basic layout.

In the present preferred embodiment, the plurality of gate electrodes 11 are arranged at intervals in the first direction X oriented along the first main surface 2a of the semiconductor layer 2. Each gate electrode 11 extends in the second direction Y intersecting (orthogonal to) to the first direction X. The plurality of contact openings 40 are arranged at intervals in the first direction X. Each contact opening 40 extends in the second direction Y. The plurality of tungsten plugs 20 are arranged at intervals in the first direction X such as to match the contact openings 40. Each tungsten plug 20 extends in the second direction Y.

According to the present arrangement, the contact openings 40 extend along the gate electrodes 11 that extend in the second direction Y and correspondingly, the tungsten plugs 20 extend along the gate electrodes 11. Meanwhile, the contact openings 40 are arranged at intervals in the first direction X and correspondingly, the tungsten plugs 20 are arranged at intervals in the first direction X. The semiconductor device 1 that is satisfactory in the connection of the electrodes can thus be provided without changing the basic layout and while reducing the stress of the tungsten plugs 20.

Also, with the present preferred embodiment, a length of the tungsten plugs 20 in the second direction Y is smaller than the length of the gate electrodes 11 in the second direction Y. The stress of the tungsten plugs 20 can thereby be reduced further and the semiconductor device 1 that is satisfactory in the device characteristics can thus be provided.

In the present preferred embodiment, the plurality of tungsten plugs 20 are laid out in an array along the first direction X and the second direction Y between each pair of mutually adjacent gate electrodes 11. The plurality of tungsten plugs 20 can thereby be dispersedly arranged uniformly between each pair of gate electrodes 11 to enable the stress of the tungsten plugs 20 to be reduced further and a contribution to be made toward improving the device characteristics.

If the plurality of tungsten plugs 20 that are aligned in the second direction Y along the gate electrode 11 are considered collectively to be one tungsten plug 20, then in the present preferred embodiment, each tungsten plug 20 can be said to be divided into a plurality of plug segments in regard to the second direction Y. The stress of the tungsten plugs 20 in the second direction Y can thereby be reduced and the device characteristics can thus be improved.

In the present preferred embodiment, recesses (the trenches 45 in the present preferred embodiment) continuous to the contact openings 40 are formed in the first main surface 2a of the semiconductor layer 2. The bottom portions of the tungsten plugs 20 contact the semiconductor layer 2 inside the recesses (the trenches 45 in the present preferred embodiment). By this arrangement, a sufficient contact area can be secured between the tungsten plugs 20 and the semiconductor layer 2 and electrical connection therebetween can thus be made reliable. The semiconductor device 1 of satisfactory electrode connection can thereby be provided.

In the present preferred embodiment, the interlayer insulating film 30 includes the first interlayer insulating film 31 of the first insulating material that contacts the gate electrode 11 and the second interlayer insulating film 32 that is constituted of the second insulating material differing from the first insulating material and covers the first interlayer insulating film 31. In more detail, in the present preferred embodiment, the first insulating material is silicon oxide that contains neither phosphorus nor boron (for example, USG) and the second insulating material is silicon oxide that contains phosphorus and boron (for example, BPSG). Correspondingly, in the present preferred embodiment, the contact openings 40 have the first openings 41 that penetrate through the first interlayer insulating film 31 and the second openings 42 that penetrate through the second interlayer insulating film 32.

Also, in the present preferred embodiment, the opening width of the second openings 42 is larger than the opening width of the first openings 41. Correspondingly, with the tungsten plugs 20, the first portions 21 embedded in the first openings 41 in the first interlayer insulating film 31 are narrow in width and the second portions 22 embedded in the second openings 42 in the second interlayer insulating film 32 are wide in width. Therefore, the embedding property of the tungsten plugs 20 in the contact openings 40 is thereby improved. Also, with the tungsten plugs 20, the top portions in contact with the electrode film 50 have a large area and therefore the electrical connection therebetween is thus made reliable. Meanwhile, in the vicinities of the first main surface 2a of the semiconductor layer 2, the tungsten plugs 20 are narrow in width and can thus be connected to the semiconductor layer 2 in narrow regions between gates.

The opening width of the first openings 41 refers to the width of the first openings 41 at a front surface (surface at the side further from the semiconductor layer 2) of the first interlayer insulating film 31. Similarly, the opening width of the second openings 42 refers to the width of the second openings 42 at a front surface (surface at the side further from the semiconductor layer 2) of the second interlayer insulating film 32. In this case, the widths mainly refer to widths in the first direction X. However, even in regard to the second direction Y, a width of the second openings 42 may be wider than a width of the first openings 41.

Also, in the present preferred embodiment, the contact openings 40 have the tapered cross section that narrows toward the first main surface 2a of the semiconductor layer 2. Thereby, the embedding property of the tungsten plugs 20 is even better and the electrode connection can thus be made reliable.

An interval between adjacent gate electrodes 11 is, for example, not less than 1 µm and not more than 3 µm. More specifically, the interval between adjacent gate electrodes 11 includes one or more ranges among not less than 1 µm and not more than 1.5 µm, not less than 1.5 µm and not more than 2.0 µm, not less than 2.0 µm and not more than 2.5 µm, and not less than 2.5 µm and not more than 3.0 µm. In such a case, the electrode connection can be made reliable, especially by use of the tungsten plugs 20.

A ratio (aspect ratio) of a depth of the contact openings 40 from a front surface of the interlayer insulating film 30 to the first main surface 2a and an opening width (for example, the width in the first direction X) of the contact openings 40 at the front surface of the interlayer insulating film 30 is, for example, not less than 1 and not more than 5. More specifically, the ratio (aspect ratio) includes one or more ranges among not less than 1 and not more than 1.5, not less than 1.5 and not more than 2, not less than 2 and not more than 2.5, not less than 2.5 and not more than 3, not less than 3 and not more than 3.5, not less than 3.5 and not more than 4, not less than 4 and not more than 4.5, and not less than 4.5 and not more than 5. In such a case, the electrode connection can be made reliable, especially by use of the tungsten plugs 20.

In the present preferred embodiment, the electrode film 50 is constituted of a metal material of lower stress than tungsten. For example, the electrode film 50 includes a metal layer having aluminum as a main component. Such a metal layer, while being lower than tungsten in embedding property with respect to the contact openings 40, is smaller in stress than tungsten. Thereby, degradation of the device characteristics due to stress of the electrode film 50 can be suppressed or prevented and reliable electrode connection can be achieved.

In the present preferred embodiment, the semiconductor layer 2 includes the drift region 13 of a first conductivity type (n-type in the present preferred embodiment), the body regions 14 of the second conductivity type (p-type in the present preferred embodiment) that are each formed in the surface layer portion of the first main surface 2a of the semiconductor layer 2 and formed in a range extending across a pair of mutually adjacent gate electrodes 11, first conductivity type regions (source regions 15) that are formed inside the body regions 14, and second conductivity type regions (contact regions 16) that are formed inside the body regions 14 and are higher in impurity concentration than the body regions 14. Each tungsten plug 20 contacts a first conductivity type region (source region 15) and a second conductivity type region (contact region 16). The electrode film 50 can thereby be connected in common to the source regions 15 and the body regions 14 by the tungsten plugs 20.

Although a preferred embodiment of the present invention has been described above, the present invention can be implemented in yet other embodiments. For example, although with the preferred embodiment described above, an example where the first conductivity type is the n-type and the second conductivity type is the p-type was described, the first conductivity type may be the p-type and the second conductivity type may be the n-type. A specific arrangement in this case is obtained by replacing the n-type regions with p-type regions and replacing the p-type regions with n-type regions in the description above and the attached drawings.

Also, although in the preferred embodiment described above, positions of the plurality of source contacts 20 (tungsten plugs 20) that are matched in the first direction X are equal in position in the second direction Y, this configuration is not necessarily required. That is, a plurality of source contacts 20 (tungsten plugs 20) that differ in position in the first direction X may differ in position in the second direction Y.

Also, although in the preferred embodiment described above, the plurality of source contacts 20 (tungsten plugs 20) are aligned in two columns between each pair of adjacent gate electrodes 11, these may be aligned in three columns or more instead.

Also, although in the preferred embodiment described above, each source contact 20 (tungsten plug 20) is formed as a band (in a rectangular shape) extending in the second direction Y, for example, each source contact 20 (tungsten plug 20) may be formed in a dot shape with which lengths in the first direction X and the second direction Y are substantially equal in plan view. Such dot-shaped source contacts 20 (tungsten plugs 20) may be laid out dispersedly between each pair of adjacent gate electrodes 11.

Although with the preferred embodiment described above, silicon was indicated as an example of the material of the semiconductor layer 2, for example, the semiconductor device 1 (SiC semiconductor device) having the semiconductor layer 2 (that is, an SiC semiconductor layer) that is constituted of silicon carbide (specifically, an SiC monocrystal) as shown in FIG. 6 may be adopted. FIG. 6 corresponds to FIG. 4 and is a sectional view for describing a structure in a case where the semiconductor layer 2 constituted of an SiC monocrystal is applied in the semiconductor device 1. In the following, structures that have been mentioned already shall be provided with the same reference symbols and description thereof shall be omitted.

The semiconductor layer 2 is preferably constituted of an SiC monocrystal that is a hexagonal crystal. The SiC monocrystal that is a hexagonal crystal has a plurality of polytypes including a 2H (hexagonal)-SiC monocrystal, a 4H-SiC monocrystal, and a 6H-SiC monocrystal in accordance with cycle of atomic arrangement. Among the plurality of polytypes, the semiconductor layer 2 is preferably constituted of a 4H-SiC monocrystal. Obviously, the SiC monocrystal of the semiconductor layer 2 may be constituted of a polytype other than a 4H-SiC monocrystal.

The first main surface 2a and the second main surface 2b of the semiconductor layer 2 are preferably formed by c-planes of the SiC monocrystal. The c-planes include a (0001) plane (silicon plane) and a (000-1) plane (carbon plane) of the SiC monocrystal. In this case, it is especially preferable for the first main surface 2a to be formed by the (0001) plane and the second main surface 2b to be formed by the (000-1) plane. Obviously, the first main surface 2a may be formed by the (000-1) plane and the second main surface 2b may be formed by the (0001) plane.

The first direction X may be set to an m-axis direction of the SiC monocrystal and the second direction Y may be set to an a-axis direction of the SiC monocrystal. In this case, in the above description, "first direction X" should be replaced by "m-axis direction" and "second direction Y" should be replaced by "a-axis direction." Oppositely, the first direction X may be set to the a-axis direction and the second direction Y may be set to the m-axis direction. In this case, in the above description, "first direction X" should be replaced by "a-axis direction" and "second direction Y" should be replaced by "m-axis direction."

In FIG. 6, an example where the first direction X is set to the m-axis direction and the second direction Y is set to the a-axis direction is shown. The a-axis direction includes a [11-20] direction and a [-1-120] direction of the SiC monocrystal. The m-axis direction includes a [1-100] direction and a [-1100] direction of the SiC monocrystal.

The first main surface 2a and the second main surface 2b may have an off angle θ inclined at an angle of not more than 10° in an off direction with respect to the c-planes of the SiC monocrystal. The off direction is preferably the a-axis direction. In this case, an a-axis of the SiC monocrystal is inclined by just the off angle θ with respect to the normal direction Z of the semiconductor layer 2. The c-axis of the SiC monocrystal is a direction of a normal to the c-planes.

The off angle θ may be set in a range of greater than 0° and not more than 2°, not less than 2° and not more than 4°, not less than 4° and not more than 6°, not less than 6° and not more than 8°, or not less than 8° and not more than 10°. The off angle θ is preferably set to greater than 0° and not more than 5°. The off angle θ may be set in a range, for example, of not less than 3.0° and not more than 4.5°. In this case, the off angle θ is preferably not less than 3.0° and not more than 3.5° or not less than 3.5° and not more than 4.0°. The off angle θ may be set in a range, for example, of not less than 1.5° and not more than 3.0°. In this case, the off angle θ is preferably not less than 1.5° and not more than 2.0° or not less than 2.0° and not more than 2.5°. Obviously, the semiconductor layer 2 that does not have the off angle θ may be adopted.

If the semiconductor layer 2 has the off angle θ inclined in the a-axis direction, it is preferably for the first direction X to be set to the m-axis direction and the second direction Y to be set to the a-axis direction as shown in FIG. 6. In this case, the trenches 45 are formed to respectively extend in the a-axis direction and at intervals in the m-axis direction in correspondence to a pattern of the source contacts 20 (tungsten plugs 20).

That is, wall surfaces of each trench 45 are demarcated by m-planes, a-planes, and a c-plane of the SiC monocrystal. The m-planes are planes of the SiC monocrystal orthogonal to the m-axis direction (that is, planes extending along the a-axis direction). The a-planes are planes of the SiC monocrystal orthogonal to the a-axis direction (that is, planes extending along the m-axis direction). The c-plane is, specifically, the silicon plane. Long side walls of the trench 45 that extend in the a-axis direction are formed by the m-planes. Also, short side walls of the trench 45 that extend in the m-axis direction are formed by the a-planes. Also, a bottom wall of the trench 45 is formed by the c-plane with the off angle θ introduced.

In this structure, the long side walls of the trench 45 extend in the a-axis direction coincident with an inclination direction of the off angle θ and therefore inclination due to the off angle θ is suppressed. On the other hand, the short side walls of the trench 45 extend in the m-axis direction orthogonal to the inclination direction of the off angle θ and therefore inclined surfaces extending along the c-axis direction are formed due to the off angle θ. However, a width of the short side walls of the trench 45 is extremely small in comparison to a width of the long side walls of the trench 45 and therefore, the inclined surface introduced in the short side walls of the trench 45 are limited.

Forming of an inclination due to the off angle θ in the wall surfaces of the trenches 45 can thereby be suppressed and the contact openings 40 can thus be put in communication with the trenches 45 appropriately. Consequently, the embedding property of the tungsten plugs 20 in the contact openings 40 (trenches 45) is improved.

Examples of features extracted from the present description and drawings are indicated below.

By arranging unit cells that include gate electrodes on a semiconductor substrate at a high density, a channel width can be enlarged and an ON resistance can be reduced. For this purpose, intervals of the gate electrodes are narrowed. Since contact openings are narrowed in width correspondingly, an aspect ratio of the contact openings formed in an interlayer insulating film increases. The aspect ratio is defined, for example, by a ratio of depth with respect to width of the contact openings.

Aluminum, which is a typical electrode material, is not necessarily satisfactory in embedding property in an opening. Therefore, if an attempt is made to embed an aluminum electrode film in a contact opening of high aspect ratio, a void may form and contact resistance between a barrier metal and the electrode film may become high or contact failure may occur.

Thus, in the following, a semiconductor device that is satisfactory in connection of electrodes and also satisfactory in device characteristics is provided.

[A1] An SiC semiconductor device (1) including an SiC semiconductor layer (2) that has a first main surface (2a) at one side and a second main surface (2b) at another side, a plurality of gate electrodes (11) that are arranged at intervals on the first main surface (2a) of the SiC semiconductor layer (2), an interlayer insulating film (30) that is formed on the first main surface (2a) of the SiC semiconductor layer (2) such as to cover the gate electrodes (11), an electrode film (50) that is formed on the interlayer insulating film (30), and a plurality of tungsten plugs (20) that, between a pair of the gate electrodes (11) that are mutually adjacent, are respectively embedded in a plurality of contact openings (40) formed in the interlayer insulating film (30) at intervals in a direction in which the pair of mutually adjacent gate electrodes (11) face each other and each have a bottom portion contacting the SiC semiconductor layer (2) and a top portion contacting the electrode film (50). By the present arrangement, an SiC semiconductor device that is satisfactory in connection of electrodes and also satisfactory in device characteristics is provided.

[A2] The SiC semiconductor device (1) according to A1, where the plurality of gate electrodes (11) are arranged at intervals in an m-axis direction of an SiC monocrystal, each gate electrode (11) extends in an a-axis direction of the SiC monocrystal, the plurality of contact openings (40) are arranged at intervals in the m-axis direction, each contact opening (40) extends in the a-axis direction, the plurality of tungsten plugs (20) are arranged at intervals in the m-axis direction such as to match the contact openings (40), and each tungsten plug (20) extends in the a-axis direction.

[A3] The SiC semiconductor device (1) according to A2, where a length in the a-axis direction of the tungsten plugs (20) is smaller than a length in the a-axis direction of the gate electrodes (11).

[A4] The SiC semiconductor device (1) according to A2 or A3, where the plurality of tungsten plugs (20) are laid out in an array along the m-axis direction and the a-axis direction between the pair of mutually adjacent gate electrodes (11).

[A5] The SiC semiconductor device (1) according to A2, where each tungsten plug (20) is divided into a plurality of plug segments in regard to the a-axis direction.

[A6] The SiC semiconductor device (1) according to A1, where the plurality of gate electrodes (11) are arranged at intervals in an a-axis direction of an SiC monocrystal, each gate electrode (11) extends in an m-axis direction of the SiC monocrystal, the plurality of contact openings (40) are arranged at intervals in the a-axis direction, each contact opening (40) extends in the m-axis direction, the plurality of tungsten plugs (20) are arranged at intervals in the a-axis direction such as to match the contact openings (40), and each tungsten plug (20) extends in the m-axis direction.

[A7] The SiC semiconductor device (1) according to A6, where a length in the m-axis direction of the tungsten plugs (20) is smaller than a length in the m-axis direction of the gate electrodes (11).

[A8] The SiC semiconductor device (1) according to A6 or A7, where the plurality of tungsten plugs (20) are laid out in an array along the a-axis direction and the m-axis direction between the pair of mutually adjacent gate electrodes (11).

[A9] The SiC semiconductor device (1) according to A6, where each tungsten plug (20) is divided into a plurality of plug segments in regard to the m-axis direction.

[A10] The SiC semiconductor device (1) according to any one of A1 to A9, where recesses (45) continuous to the contact openings (40) are formed in the first main surface (2a) of the SiC semiconductor layer (2) and the bottom portions of the tungsten plugs (20) contact the SiC semiconductor layer (2) inside the recesses (45).

[A11] The SiC semiconductor device (1) according to any one of A1 to A10, where the interlayer insulating film (30) includes a first interlayer insulating film (31) of a first insulating material that contacts the gate electrodes (11) and a second interlayer insulating film (32) that is constituted of a second insulating material differing from the first insulating material and covers the first interlayer insulating film (31).

[A12] The SiC semiconductor device (1) according to A11, where the first insulating material is silicon oxide that contains neither phosphorus nor boron and the second insulating material is silicon oxide that contains phosphorus and boron.

[A13] The SiC semiconductor device (1) according to A11 or A12, where the contact openings (40) each have a first opening (41) penetrating through the first interlayer insulating film (31) and a second opening (42) penetrating through the second interlayer insulating film (32) and an opening width of the second opening (42) is larger than an opening width of the first opening (41).

[A14] The SiC semiconductor device (1) according to any one of A1 to A13, where the contact openings (40) each have a tapered cross section that narrows toward the first main surface (2a) of the SiC semiconductor layer (2).

[A15] The SiC semiconductor device (1) according to any one of A1 to A13, where an interval between the gate electrodes (11) that are adjacent is not less than 1 μm and not more than 3 μm.

[A16] The SiC semiconductor device (1) according to any one of A1 to A15, where a ratio of a depth of the contact openings (40) from a front surface of the interlayer insulating film (30) to the first main surface (2a) and an opening width of the contact openings (40) at the front surface of the interlayer insulating film (30) is not less than 1 and not more than 5.

[A17] The SiC semiconductor device (1) according to any one of A1 to A16, where the electrode film (50) is constituted of a metal material that is lower in stress than tungsten.

[A18] The SiC semiconductor device (1) according to any one of A1 to A17, where the electrode film (50) includes a metal layer having aluminum as a main component.

[A19] The SiC semiconductor device (1) according to any one of A1 to A18, where the SiC semiconductor layer (2) includes a drift region (13) of a first conductivity type, a body region (14) of a second conductivity type that is formed in a surface layer portion of the first main surface (2a) of the SiC semiconductor layer (2) and formed in a range extending across the pair of mutually adjacent gate electrodes (11), a first conductivity type region (15) that is formed inside the body region (14), and a second conductivity type region (16) that is formed inside the body region (14) and is higher in impurity concentration than the body region (14), and each tungsten plug (20) contacts the first conductivity type region (15) and the second conductivity type region (16).

[A20] The SiC semiconductor device (1) according to any one of A1 to A19, where the first main surface (2a) has an off angle of not more than 10°.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
a semiconductor layer that is constituted of an SiC monocrystal, and that has a first main surface at one side and a second main surface at another side;
p-type body regions formed in a surface layer portion of the first main surface of the semiconductor layer;
n$^+$-type source regions formed on front surfaces of the p-type body regions;
planar gate structures planar gate structures, each of which including a gate insulating film and a gate electrode formed on the gate insulating film, and that are arranged at intervals on the first main surface of the semiconductor layer and are positioned above and between the p-type body regions;
an interlayer insulating film that is formed on the first main surface of the semiconductor layer such as to cover the gate insulating film and the gate electrodes; and
a tungsten contact plug that is embedded in a contact opening formed in the interlayer insulating film at a region between the gate electrodes and having a tapered shape that narrows toward the first main surface of the semiconductor layer in a cross-sectional view, wherein
the n$^+$-type source regions are placed on the first main surface,
a peripheral edge of each of the n$^+$-type source regions is positioned at an interval inward from a peripheral edge of the corresponding p-type body regions,
peripheral portions of the p-type body regions are placed on the first main surface,
in a state where an appropriate voltage is applied to the gate electrodes, the peripheral portions of the p-type body regions directly below the gate electrodes function as channel regions,
the contact opening has a first opening that penetrates through the gate insulating film and has a tapered shape narrowing toward the first main surface in the cross-sectional view, and a second opening that penetrates through the interlayer insulating film and has a tapered shape that narrows toward the first opening in the cross-sectional view,
an opening width of the second opening is larger than an opening width of the first opening, and
an inclination angle of a side wall of the second opening with respect to a normal direction of the first main surface is different from an inclination angle of a side wall of the first opening with respect to the normal direction.

2. The semiconductor device according to claim 1, wherein
the gate electrodes are arranged at intervals in a first direction oriented along the first main surface of the semiconductor layer and extend in a second direction intersecting the first direction, and
the tungsten contact plug is embedded in the contact opening extending in the second direction.

3. The semiconductor device according to claim 2, further comprising:
a plurality of the tungsten contact plugs that are embedded in contact openings formed in the interlayer insulating film at regions between mutually adjacent gate electrodes, wherein
the plurality of tungsten contact plugs are laid out in an array along the first direction and the second direction between the mutually adjacent gate electrodes.

4. The semiconductor device according to claim 1, wherein
a recess continuous to the contact opening is formed in the first main surface of the semiconductor layer, and
the tungsten contact plug has a bottom portion that is positioned in the recess.

5. The semiconductor device according to claim 4, wherein
the recess has a side wall that exposes the n$^+$-type source region, and
the tungsten contact plug is in contact with the n$^+$-type source region in the side wall of the recess.

6. The semiconductor device according to claim 1, wherein
an interval between mutually adjacent gate electrodes is not less than 1 μm.

7. The semiconductor device according to claim 1, further comprising:
p$^+$-type contact regions each provided directly below the corresponding n$^+$-type source regions, wherein
a width of the p$^+$-type contact region is wider than a width of the tungsten contact plug in a cross-sectional view.

8. The semiconductor device according to claim 1, wherein
an interface between the n$^+$-type source region and the channel region is placed on a center side portion of the gate electrode in a cross-sectional view.

9. The semiconductor device according to claim 1, wherein
a transistor cell including the p-type body region, the n$^+$-type source region, and the gate electrode has a band shape extending in one direction along the first main surface of the semiconductor layer.

10. The semiconductor device according to claim 1, wherein
a width of the n$^+$-type source region is wider than a width of the channel region in a cross-sectional view.

11. The semiconductor device according to claim 1, further comprising:

an electrode film that is formed on the interlayer insulating film.

12. The semiconductor device according to claim 11, wherein
the electrode film is constituted of a metal material that is lower in stress than tungsten.

13. The semiconductor device according to claim 11, wherein
the electrode film includes a metal layer having aluminum as a main component.

14. The semiconductor device according to claim 1, wherein
a ratio of a depth of the contact opening from a front surface of the interlayer insulating film to the first main surface and an opening width of the contact opening at the front surface of the interlayer insulating film is not less than 1 and not more than 5.

15. The semiconductor device according to claim 1, wherein
the first main surface has an off angle of not more than 10°.

16. The semiconductor device according to claim 1, wherein
the gate electrodes extend in a line shape along one direction in plane views.

17. The semiconductor device according to claim 1, wherein
an aspect ratio of a depth of the contact opening and an opening width of the contact opening is not less than 1 and not more than 5.

18. The semiconductor device according to claim 1, wherein
the interlayer insulating film includes a first interlayer insulating film and a second interlayer insulating film that are laminated in that order from the first main surface side,
the first opening penetrates through the gate insulating layer and the first interlayer insulating film,
the second opening penetrates through the second interlayer insulating film,
and
the inclination angle of the side wall of the second opening with respect to the normal direction of the first main surface is larger than the inclination angle of the side wall of the first opening with respect to the normal direction.

19. The semiconductor device according to claim 1, wherein
the tungsten contact plug has an upper end portion that is positioned on an upper side with respect to upper surfaces of the gate electrodes and a lower end portion that is positioned on a lower side with respect to lower surfaces of the gate electrodes in cross-sectional view.

20. A semiconductor device comprising:
a semiconductor layer that is constituted of an SiC monocrystal, and that has a first main surface at one side and a second main surface at another side;
p-type body regions formed in a surface layer portion of the first main surface of the semiconductor layer;
n+-type source regions formed on front surfaces of the p-type body regions;
gate electrodes that are planar gate structures, wherein the gate electrodes are arranged at intervals on the first main surface of the semiconductor layer in a first direction oriented along the first main surface, extend in a second direction intersecting the first direction, and are positioned above and between the p-type body regions;
an interlayer insulating film that is formed on the first main surface of the semiconductor layer such as to cover the gate electrodes; and
a plurality of tungsten contact plugs that are embedded in contact openings which are formed in the interlayer insulating film at regions between the mutually adjacent gate electrodes and extend in the second direction, wherein
the n+-type source regions are placed on the first main surface,
a peripheral edge of each of the n+-type source regions is positioned at an interval inward from a peripheral edge of the corresponding p-type body regions,
peripheral portions of the p-type body regions are placed on the first main surface, in a state where an appropriate voltage is applied to the gate electrodes, the peripheral portions of the p-type body regions directly below the gate electrodes function as channel regions, and
the plurality of tungsten contact plugs are laid out in an array along the first direction and the second direction between the mutually adjacent gate electrodes.

* * * * *